United States Patent
Yamazaki (10) Patent No.: US 7,199,024 B2
(45) Date of Patent: Apr. 3, 2007

(54) METHOD OF MANUFACTURING A SEMICONDUCTOR DEVICE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 34 days.

(21) Appl. No.: 10/759,297

(22) Filed: Jan. 20, 2004

(65) Prior Publication Data

US 2004/0147095 A1   Jul. 29, 2004

Related U.S. Application Data

(62) Division of application No. 10/124,344, filed on Apr. 18, 2002, now abandoned, which is a division of application No. 09/337,333, filed on Jun. 21, 1999, now Pat. No. 6,380,046.

(30) Foreign Application Priority Data

Jun. 22, 1998   (JP) ................... 10-174482

(51) Int. Cl.
    *H01L 21/30*   (2006.01)
    *H01L 21/46*   (2006.01)
(52) U.S. Cl. .............. 438/455; 438/406; 438/459
(58) Field of Classification Search ........... 438/455, 438/450, 459, 689–692, 406, 408–409
See application file for complete search history.

(56) References Cited

U.S. PATENT DOCUMENTS 4,583,122 A     4/1986  Ohwada et al.
4,665,419 A  *  5/1987  Sasaki ................. 257/354
4,786,955 A  * 11/1988  Plus et al. ............. 257/351
5,130,770 A     7/1992  Blanc et al.
5,258,323 A  * 11/1993  Sarma et al. ............ 438/29
5,261,999 A    11/1993  Pinker et al.
5,317,236 A     5/1994  Zavracky et al.
5,341,028 A     8/1994  Yamaguchi et al.

(Continued)

FOREIGN PATENT DOCUMENTS

EP           0 485 233         5/1992

(Continued)

OTHER PUBLICATIONS

Bruel, Silicon on insulator material technology, Jul. 1995, Electonics Letters, vol. 34, Issue 14, pp. 1201-1202.*

(Continued)

*Primary Examiner*—Zandra V. Smith
*Assistant Examiner*—Thanh Y. Tran
(74) *Attorney, Agent, or Firm*—Eric J. Robinson; Robinson Intellectual Property Law Office, P.C.

(57) ABSTRACT

There is provided a method of removing trap levels and defects, which are caused by stress, from a single crystal silicon thin film formed by an SOI technique. First, a single crystal silicon film is formed by using a typical bonding SOI technique such as Smart-Cut or ELTRAN. Next, the single crystal silicon thin film is patterned to form an island-like silicon layer, and then, a thermal oxidation treatment is carried out in an oxidizing atmosphere containing a halogen element, so that an island-like silicon layer in which the trap levels and the defects are removed is obtained.

24 Claims, 10 Drawing Sheets

U.S. PATENT DOCUMENTS

| | | | |
|---|---|---|---|
| 5,387,555 A * | 2/1995 | Linn et al. | 438/455 |
| 5,550,070 A | 8/1996 | Funai et al. | |
| 5,569,620 A * | 10/1996 | Linn et al. | 438/406 |
| 5,574,292 A | 11/1996 | Takahashi et al. | |
| 5,581,092 A | 12/1996 | Takemura | |
| 5,710,057 A | 1/1998 | Kenney | |
| 5,750,000 A | 5/1998 | Yonehara | |
| 5,821,138 A | 10/1998 | Yamazaki et al. | |
| 5,840,616 A | 11/1998 | Sakaguchi et al. | |
| 5,849,627 A * | 12/1998 | Linn et al. | 438/455 |
| 5,854,123 A | 12/1998 | Sato et al. | |
| 5,962,897 A | 10/1999 | Takemura et al. | |
| 5,966,594 A * | 10/1999 | Adachi et al. | 438/151 |
| 5,966,620 A | 10/1999 | Sakaguchi et al. | |
| 5,982,002 A | 11/1999 | Takasu et al. | |
| 6,051,453 A | 4/2000 | Takemura | |
| 6,054,363 A | 4/2000 | Sakaguchi et al. | |
| 6,118,148 A | 9/2000 | Yamazaki | |
| 6,184,556 B1 | 2/2001 | Yamazaki et al. | |
| 6,207,969 B1 | 3/2001 | Yamazaki | |
| 6,262,438 B1 | 7/2001 | Yamazaki et al. | |
| 6,287,900 B1 | 9/2001 | Yamazaki et al. | |
| 6,455,401 B1 * | 9/2002 | Zhang et al. | 438/486 |

FOREIGN PATENT DOCUMENTS

| | | |
|---|---|---|
| JP | 10-012889 | 1/1998 |
| JP | 10-064817 | 3/1998 |
| JP | 10-133233 | 5/1998 |
| JP | 10-135350 | 5/1998 |

OTHER PUBLICATIONS

K. Sakaguchi et al., "Current Progress in Epitaxial Layer Transfer (ELTRAN)," IEICE Trans. Electron, vol. E80 C. No. 3, pp. 378-387, Mar. 1997.

A.J. Auberton-Herve et al., "Industrial Research Society (Kogyo Chosa Kai)," Electronic Material, pp. 83-87, Aug. 1997.

* cited by examiner

METHOD OF MANUFACTURING A SEMICONDUCTOR DEVICE

BACKGROUND OF THE INVENTION

1. Field of the Invention

The present invention relates to a method of manufacturing a thin film transistor (hereinafter referred to as TFT) using a single crystal silicon thin film formed on a substrate having an insulating surface, and to a method of manufacturing a semiconductor device including a semiconductor circuit constituted by TFTs.

Incidentally, in the present specification, the semiconductor device indicates any device capable of functioning by using semiconductor characteristics, and the category thereof includes an electro-optical device typified by a liquid crystal display device, a semiconductor circuit in which TFTs are integrated, and an electronic apparatus including such an electro-optical device or semiconductor circuit as a part.

2. Description of the Related Art

In recent years, VLSI techniques have been remarkably developed, and an attention has been paid to an SOI (Silicon on Insulator) structure for realizing low power consumption. This technique is such a technique that an active region (a channel formation region) of an FET, which has been conventionally formed of bulk single crystal silicon, is formed of a single crystal silicon thin film.

In an SOI substrate, a buried oxide film made of silicon oxide exists on single crystal silicon, and a single crystal silicon thin film is formed thereon. Although various methods are known as methods of manufacturing such an SOI substrate, an attention has been recently paid to a bonded SOI substrate. The bonded SOI substrate realizes the SOI structure by bonding two silicon substrates as suggested by its name. This technique has a possibility that a single crystal silicon thin film can be formed in future also on a glass substrate or the like.

Among the bonded SOI substrates, in recent years, an attention has been especially paid to a technique called Smart-Cut (registered trademark of SOITEC Co.). Smart-Cut method is a technique developed by SOITEC Co. in France in 1996, and is a method of manufacturing a bonded SOI substrate using hydrogen embrittlement. The particular technique of the Smart-Cut method is disclosed in "Industrial Research Society (Kogyo Chosa Kai); Electronic Material, August, pp. 83–87, 1977" in detail.

As another method, there is known a technique called ELTRAN (trademark of Canon K.K.). This technique is a method of manufacturing an SOI substrate using selective etching of a porous silicon layer. The particular technique of ELTRAN method is disclosed in "T. Yonehara, K Sakaguchi and T. Hamaguchi: Appl. Phys. Lett. 43[3], 253 (1983)" in detail.

Even if either one of the methods is used, a single crystal silicon thin film having a desired thickness can be formed on a substrate. However, in both methods, since a high temperature heat treatment is carried out in a step of bonding two substrates, there arises a problem in which intense stress is generated and remains in the formed single crystal silicon film.

If the stress at this time remains in an active layer of a TFT formed of the single crystal silicon thin film, it may function as trap levels for carriers or may become a factor to cause change in TFT characteristics with time elapses. This problem is a very important problem when Smart-Cut method or ELTRAN method is used, and a fundamental solution thereof has been required.

SUMMARY OF THE INVENTION

The present invention has been made to solve the foregoing problem, and an object of the present invention is to provide a method of removing trap levels and defects due to stress, from a single crystal silicon thin film formed by Smart-Cut method or ELTRAN method.

Another object of the present invention is to improve an operation performance of a TFT that employs such a single crystal silicon thin film, and further to improve an operation performance and reliability of a semiconductor circuit or an electro-optical device employing TFTs.

Still another object of the present invention is to improve an operation performance and reliability of an electronic equipment incorporating such a semiconductor circuit or an electro-optical device.

According to one aspect of the present invention, a method of manufacturing a semiconductor device is characterized by comprising a first step of forming a hydrogen added layer by adding hydrogen to a first single crystal silicon substrate having a silicon oxide film on a major surface, from a major surface side; a second step of bonding the first single crystal silicon substrate to a second substrate as a support through the silicon oxide film; a third step of separating the first single crystal silicon substrate by a first heat treatment; a fourth step of carrying out a second heat treatment to a single crystal silicon thin film having remained on the second substrate in the third step; a fifth step of flattening a major surface of the single crystal silicon thin film; a sixth step of forming an island-like silicon layer by patterning the single crystal silicon thin film; and a seventh step of carrying out a thermal oxidation treatment to the island-like silicon layer.

According to another aspect of the present invention, a method of manufacturing a semiconductor device is characterized by comprising a first step of forming a hydrogen added layer by adding hydrogen to a first single crystal silicon substrate having a silicon oxide film on a major surface, from a major surface side; a second step of bonding the first single crystal silicon substrate to a second substrate as a support through the silicon oxide film; a third step of separating the first single crystal silicon substrate by a first heat treatment; a fourth step of flattening a major surface of a single crystal silicon thin film having remained on the second substrate in the third step; a fifth step of forming an island-like silicon layer by patterning the single crystal silicon thin film; and a sixth step of carrying out a thermal oxidation treatment to the island-like silicon layer.

According to still another aspect of the present invention, a method of manufacturing a semiconductor device is characterized by comprising a first step of forming a porous silicon layer by anodic oxidation of a first single crystal silicon substrate; a second step of making epitaxial growth of a single crystal silicon thin film on the porous silicon layer; a third step of forming a silicon oxide film on the single crystal silicon thin film; a fourth step of bonding the first single crystal silicon substrate to a second substrate as a support through the silicon oxide film; a fifth step of carrying out a first heat treatment to the first single crystal silicon substrate and the second substrate; a sixth step of polishing the first single crystal silicon substrate until the porous silicon layer is exposed; a seventh step of exposing the single crystal silicon thin film by removing the porous silicon layer; an eighth step of forming an island-like silicon layer by patterning the single crystal silicon thin film; and a ninth step of carrying out a thermal oxidation treatment to the island-like silicon layer.

According to still another aspect of the present invention, a method of manufacturing a semiconductor device is characterized by comprising a first step of forming a porous silicon layer by anodic oxidation of a first single crystal silicon substrate; a second step of making epitaxial growth of a single crystal silicon thin film on the porous silicon layer; a third step of forming a silicon oxide film on the single crystal silicon thin film; a fourth step of bonding the first single crystal silicon substrate to a second substrate as a support through the silicon oxide film; a fifth step of polishing the first single crystal silicon substrate until the porous silicon layer is exposed; a sixth step of exposing the single crystal silicon thin film by removing the porous silicon layer; a seventh step of forming an island-like silicon layer by patterning the single crystal silicon thin film; and an eighth step of carrying out a thermal oxidation treatment to the island-like silicon layer.

The thermal oxidation treatment is carried out at a temperature in a range of from 1050 to 1150° C. (typically 1100° C.). When the temperature exceeds about 1100° C., the stress relaxation of Si—O—Si bond occurs and the bonded interface is stabilized.

In addition, in the structure described above, it is preferable that the thermal oxidation treatment is carried out in an oxidizing atmosphere containing a halogen element. As the oxidizing atmosphere containing the halogen element, it is appropriate that a mixture gas of oxygen and hydrogen chloride (HCl) or a mixture gas of oxygen and nitrogen trifluoride ($NF_3$) is used.

Of course, as other methods, dry $O_2$ oxidation, wet $O_2$ oxidation, steam (water vapor) oxidation, pyrogenic oxidation (hydrogen burning oxidation), oxygen partial pressure oxidation, or the like may also be used.

The present invention has the structure as described above. However, the most important gist of the invention is to carry out the heat treatment step at a high temperature to the island-like silicon layer made of the single crystal silicon thin film formed by using Smart-Cut method or ELTRAN method. By this, the stress within the single crystal silicon layer is relaxed, and trap levels and defects caused by stress distortions can be removed from an active layer of a TFT.

Thus, it becomes possible to restore the crystallinity of a final active layer to almost the original state of the single crystal, and to improve the operation performance and reliability of a TFT. Further, it becomes possible to improve the operation performance and reliability of any semiconductor device in which a semiconductor circuit is constituted by TFTs.

DETAILED DESCRIPTION OF THE PREFERRED EMBODIMENTS

Detailed descriptions of preferred embodiments of the present invention will be made in conjunction with embodiments described below.

Embodiment 1

Figure 1A:
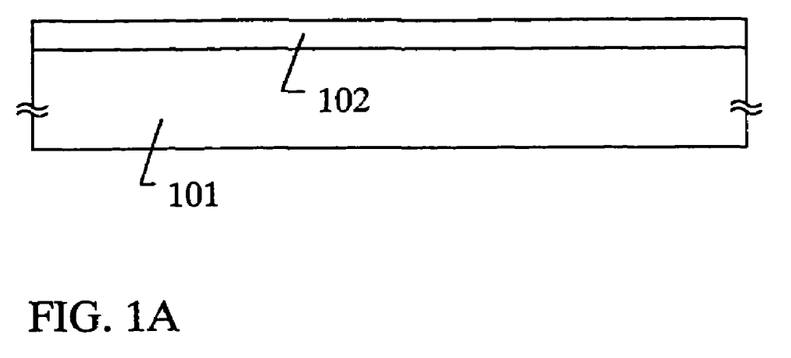
FIGS. 1A to 1C are views showing forming steps of an island-like silicon layer of Embodiment 1.

A structure of the present invention will be described with reference to FIGS. 1A to 1C and FIGS. 2A to 2D. First, a single crystal silicon substrate 101 is prepared. Next, a thermal oxidation treatment is carried out to form a silicon oxide film 102 on a major surface (component formation surface) of the substrate. Although the film thickness may be suitably determined by an operator, it is appropriate that the thickness is made 0.05 to 0.5 μm. This silicon oxide film 102 subsequently functions as a buried oxide film of an SOI substrate (FIG. 1A).

Figure 1B:
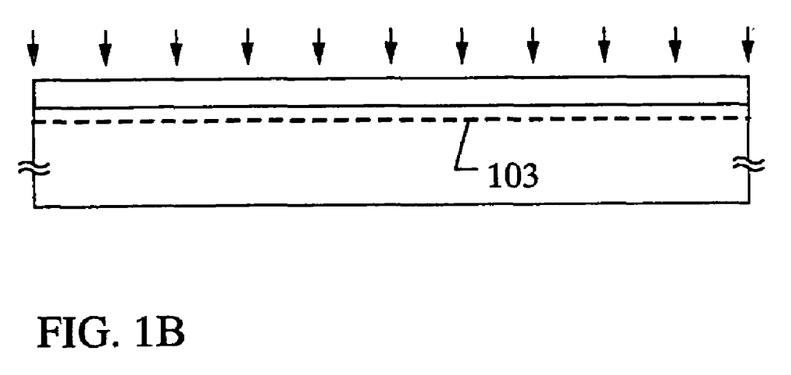

Next, hydrogen is added from the major surface side of the single crystal silicon substrate 101 through the silicon oxide film 102. In this case, it is appropriate that an addition of hydrogen is carried out by ion implantation method in the form of hydrogen ions. Of course, the adding step of hydrogen can be carried out by other means. In this way, a hydrogen added layer 103 is formed. In this embodiment, the hydrogen ion with a dosage of $1\times10^{16}$ to $1\times10^{17}$ atoms/$cm^2$ is added (FIG. 1B).

It should be noted that since the depth of the hydrogen added layer 103 to be formed determines the film thickness of a single crystal silicon thin film later, precise control thereof is necessary. In this embodiment, the control of a hydrogen addition profile in the depth direction is carried out so that a single crystal silicon layer with a thickness of 50 nm remains between the major surface of the single crystal silicon substrate 101 and the hydrogen added layer 103.

Figure 1C:
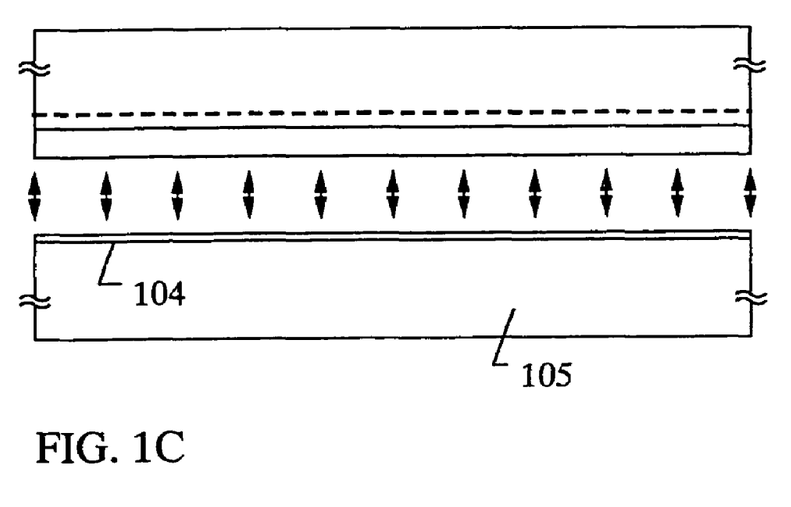

Next, the single crystal silicon substrate 101 is bonded to a substrate (second substrate) having an insulating surface. As the second substrate, a substrate having a surface provided with a thin silicon oxide film is typically used. As the substrate, a substrate with high heat resistance, such as a silicon substrate, a quartz substrate, a ceramic substrate, or a crystallized glass substrate, is used. In this embodiment, a silicon substrate 105 provided with a thin silicon oxide film 104 is used (FIG. 1C).

At this time, since both interfaces to be bonded are silicon oxide films having high hydrophilic properties, they adhere to each other with hydrogen bond by the reaction of moisture contained in both surfaces.

Figure 2A:
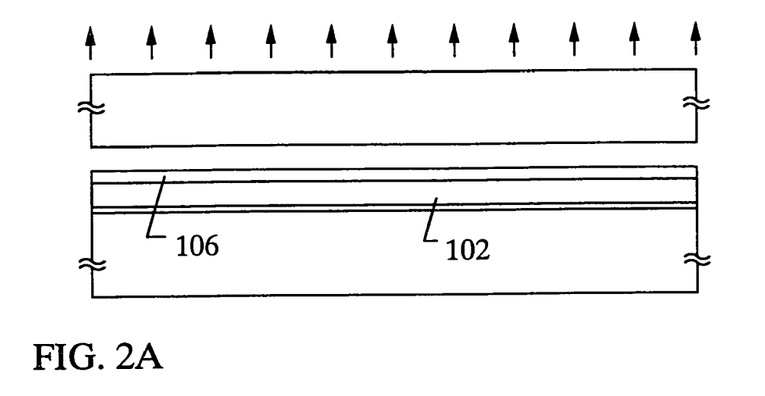
FIGS. 2A to 2D are views showing forming steps of the island-like silicon layer of Embodiment 1.

Next, a heat treatment (first heat treatment) of 400 to 600° C. (typically 500° C.) is carried out. By this heat treatment, volume change of minute depletion occurs in the hydrogen added layer 103, so that a fracture surface is produced along the hydrogen added layer 103. By this, the first single crystal silicon substrate 101 is separated, and the silicon oxide film 102 and a single crystal silicon thin film 106 remains on the second substrate (FIG. 2A).

Figure 2B:
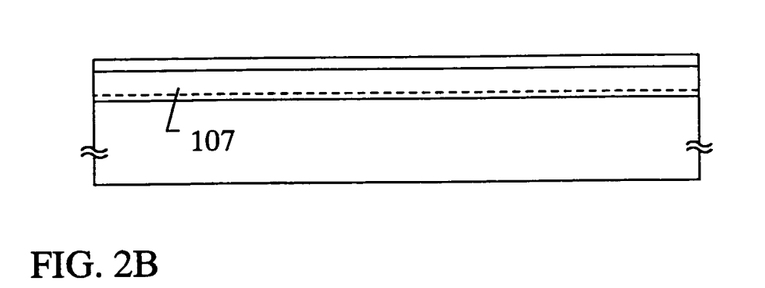

Next, as a second heat treatment, a furnace annealing step is carried out in the temperature range of 1050 to 1150° C. In this step, at the bonded interface, stress relaxation of Si—O—Si bond occurs, so that the bonded interface becomes stable. That is, this becomes a step for completely making the single crystal silicon thin film 106 adhere onto the second substrate 104. In this embodiment, this step is carried out at a temperature of 1100° C. for two hours.

The bonded interface is stabilized in this way, so that a buried oxide film 107 is defined. Incidentally, in FIG. 2B, a dotted line in the buried oxide film 107 indicates the bonded interface, and it means that the interface is strongly made to adhere.

Next, the surface of the single crystal silicon thin film 106 is flattened by a polishing step. Although any well-known means may be used for the polishing step, it is appropriate that the polishing technique called CMP (Chemical Mechanical Polishing) is used.

Figure 2C:
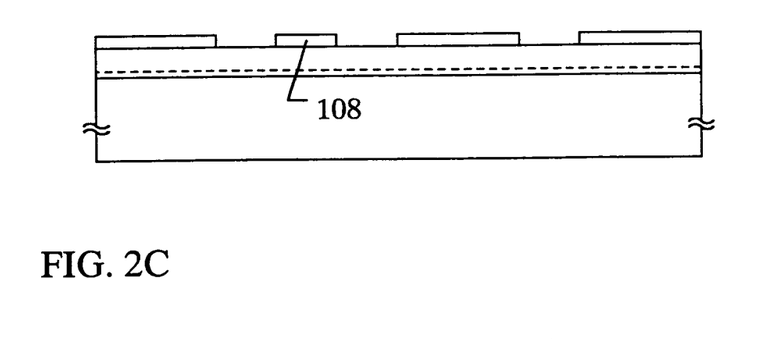

Next, the single crystal silicon thin film 106 is patterned to form island-like silicon layers 108 that subsequently become active layers of TFTs (FIG. 2C).

The steps so far are the same as ordinary Smart-Cut method. The important feature of the present invention is a thermal oxidation step subsequent to this.

Figure 2D:
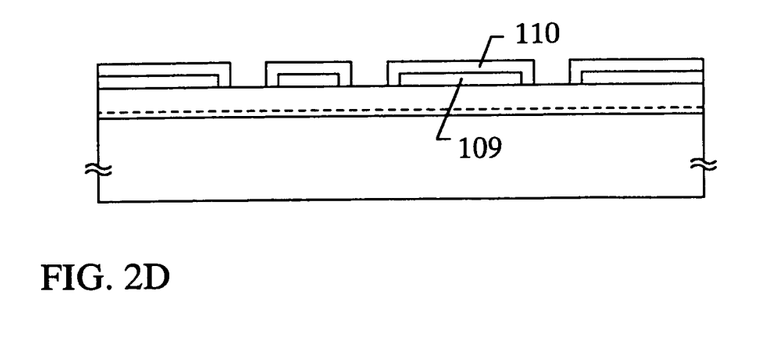

Next, a thermal oxidation treatment is carried out for the plurality of island-like layers 108. Trap levels and defects existing inside the island-like silicon layers 108 disappear through this thermal oxidation treatment, so that island-like silicon layers 109 with restored crystallinity are formed. Reference numeral 110 denotes a silicon oxide film formed by the thermal oxidation treatment. This silicon oxide film 110 may be used as a gate insulating film of a TFT.

Although it is satisfactory if this thermal oxidation treatment is carried out in an oxidizing atmosphere, it is preferable that the thermal oxidation treatment is carried out in the oxidizing atmosphere containing a halogen element. In this embodiment, the thermal oxidation treatment at 800° C. for two hours is carried out in an oxidizing atmosphere containing nitrogen trifluoride ($NF_3$).

The object of this step is to relax the stress remaining inside the island-like silicon layers 108. This point will be described.

When the heat treatment at a high temperature is applied at the step of FIG. 2B, intense stress is applied to the single crystal silicon thin film 106. As a result, trap levels and the defects caused by the stress are produced inside the thin film. The trap levels and defects remain even after the film is patterned into active layers. Such trap levels naturally become a cause to block the movement of carriers (electron or hole), and remarkably lower the TFT characteristics.

However, in the structure of the present invention, the thermal oxidation step of FIG. 2D is carried out, so that the trap levels and the defects inside the island-like silicon layers is eliminated, and it is possible to realize a great improvement of the TFT characteristics and an improvement of reliability.

Embodiment 2

This embodiment is an example in which the sequence of the manufacturing steps of embodiment 1 is changed. Until the middle of the steps, steps are the same as in embodiment 1, so that their explanation will be omitted.

First, in the same procedure as in embodiment 1, steps until the substrate separating step of FIG. 2A are completed. Next, after the single crystal silicon thin film remaining on the second substrate is polished by means of such as CMP and is flattened, a patterning step is carried out to form island-like silicon layers.

When the island-like silicon layers are formed, a thermal oxidation treatment is carried out in that state. That is, the feature of this embodiment resides in that the stabilization of the bonded interface and the reduction of trap levels and defects in the island-like silicon layers are carried out by the same heat treatment (temperature range is 1050 to 1150° C.) simultaneously.

As described above, the second heat treatment for stabilizing the bonded interface and the thermal oxidation step for reducing the trap levels and the defects are separately carried out in embodiment 1. However, both the steps are carried out in one step in this embodiment, so that the number of steps can be reduced.

Embodiment 3

Embodiments 1 and 2 show examples in which trap levels and defects are reduced from the single crystal silicon thin films formed by Smart-Cut method. However, the present invention is also effective for a single crystal silicon thin film formed by other bonding SOI techniques.

In this embodiment, an example in which the present invention is applied to a single crystal silicon thin film formed by ELTRAN method as one of the bonding SOI techniques will be described with reference to FIGS. 3A to 3D and FIGS. 4A to 4D.

Figure 3A:
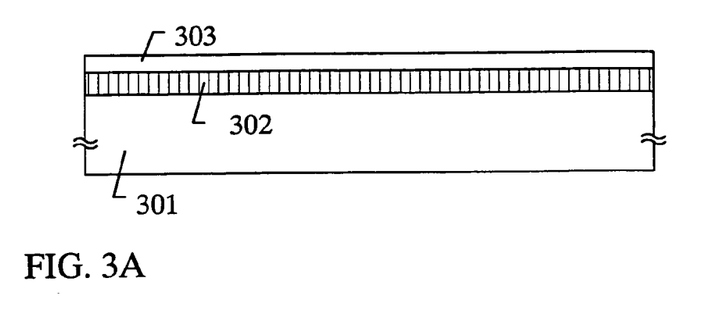
FIGS. 3A to 3D are views showing forming steps of an island-like silicon layer of Embodiment 3.

First, a single crystal silicon substrate 301 is prepared, and its major surface is subjected to anodic oxidation so that a porous silicon layer 302 is formed. It is appropriate that the anodic oxidation step is carried out in a mixture solution of hydrofluoric acid and ethanol. Since ELTRAN method itself is well known, the detailed description will be omitted here.

A single crystal silicon thin film 303 having a thickness of 100 nm is formed on the porous silicon layer 302 by epitaxial growth (FIG. 3A).

Figure 3B:
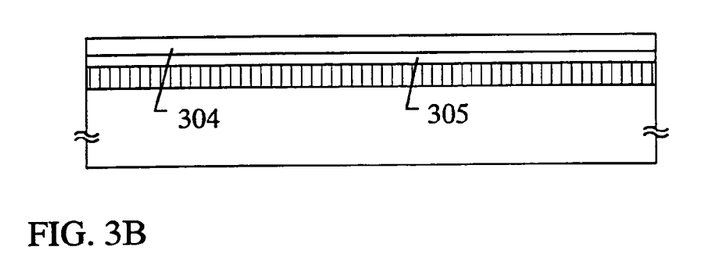

After the single crystal silicon thin film 303 is formed, a thermal oxidation step is carried out so that a silicon oxide film 304 having a thickness of 100 nm is formed on the single crystal silicon thin film. The silicon oxide film 304 subsequently functions as a buried oxide film of an SOI substrate. In addition, by this thermal oxidation step, the thickness of a single crystal silicon thin film 305 becomes 50 nm (FIG. 3B).

Figure 3C:
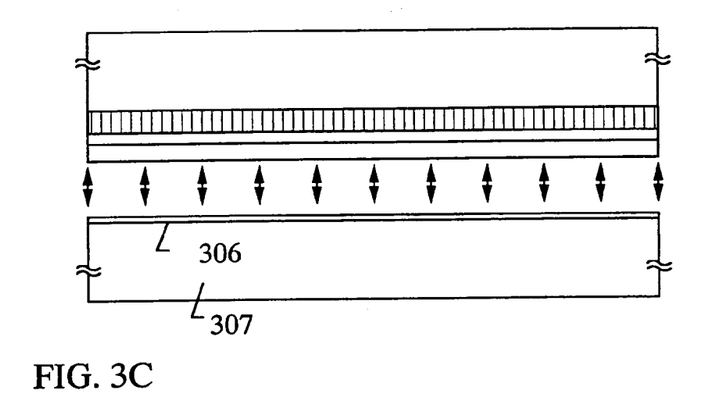

Next, the single crystal silicon substrate 301 is bonded to a ceramic substrate (second substrate) 307 having a thin silicon oxide film 306 formed on its surface (FIG. 3C).

Figure 3D:
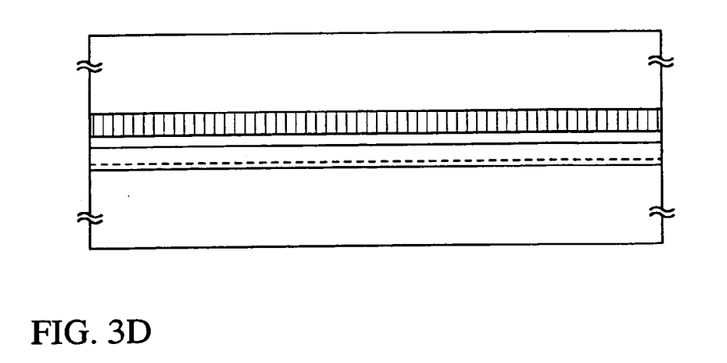

After bonding is finished, a heat treatment step is then carried out at a temperature in a range of from 1050 to 1150° C., so that the bonded interface made of the silicon oxide films is stabilized. In this embodiment, this heat treatment step is carried out at 1100° C. for two hours. Incidentally, as explained in embodiment 1 as well, a dotted line indicates the bonded interface of complete adhesion (FIG. 3D).

Figure 4A:
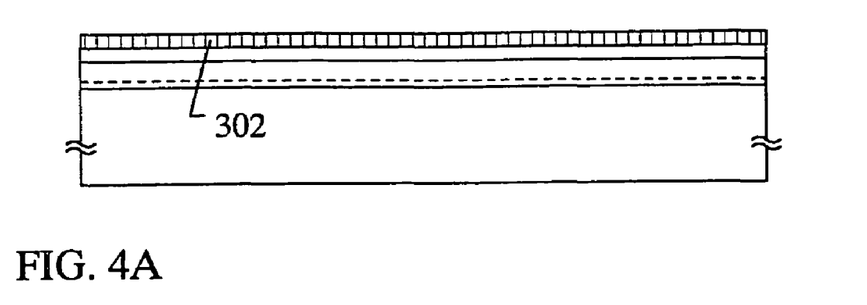
FIGS. 4A to 4D are views showing forming steps of the island-like silicon layer of Embodiment 3.

Next, the single crystal silicon substrate 301 is polished from its back side by a mechanical polishing such as CMP, and polishing is ended when the porous silicon layer 302 is exposed. In this way, the state of FIG. 4A is obtained.

Figure 4B:
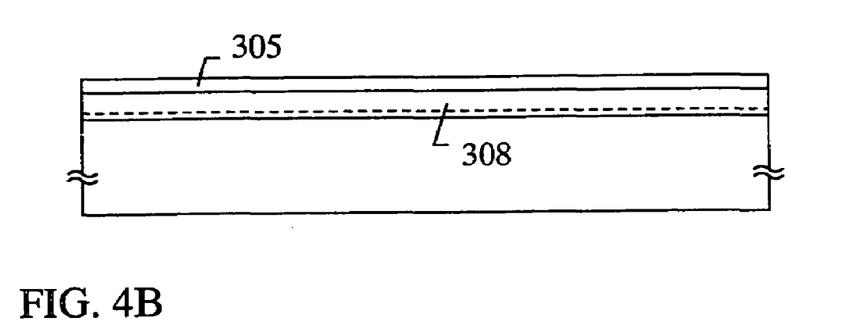

Next, the porous silicon layer 302 is selectively removed by wet etching. As an etchant to be used, a mixture solution of a hydrofluoric acid solution and a hydrogen peroxide solution is suitable. It is reported that a mixture solution containing 49% HF and 30% $H_2O_2$ at a ratio of 1:5 has a selecting ratio of not less than hundred thousand times between a single crystal silicon layer and a porous silicon layer.

In this way, the state of FIG. 4B is obtained. In this state, such a state is obtained that a buried oxide film 308 (strictly speaking, a laminate film of the silicon oxide films 304 and 306) is provided on the ceramic substrate 307, and the single crystal silicon thin film 305 is formed thereon.

Figure 4C:
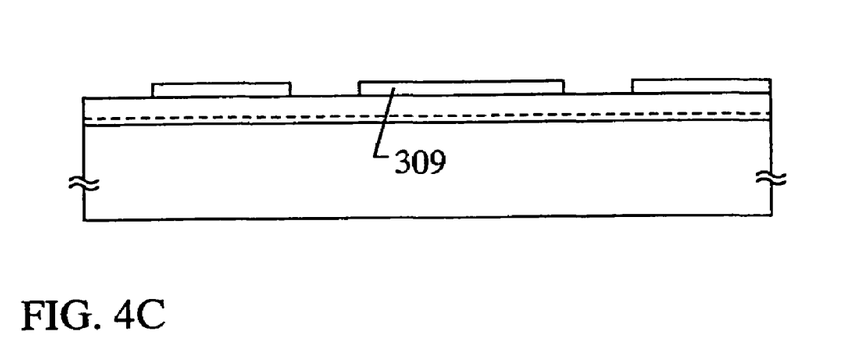

Next, the single crystal silicon thin film 305 is subjected to patterning, so that island-like silicon layers 309 are formed. Of course, each of the island-like silicon layers is basically used as an active layer of a TFT (FIG. 4C).

The numerical value conditions and the like explained so far are not limited to those of this embodiment, but the technique of well-known ELTRAN method can be used as it is.

Figure 4D:
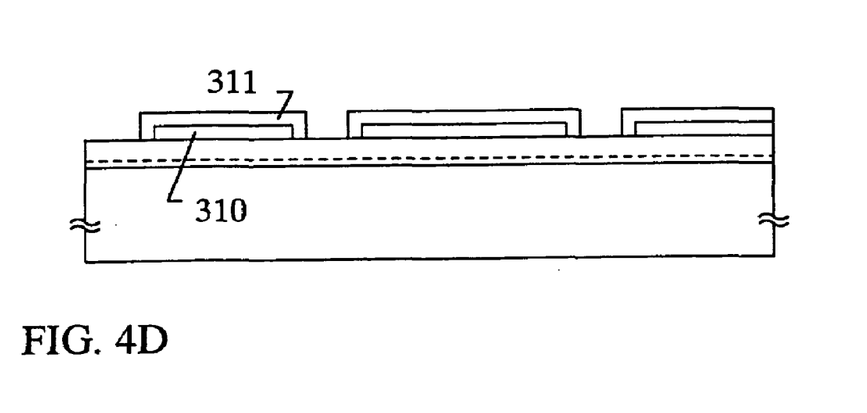

After the island-like silicon layers 309 are formed, a thermal oxidation step of the feature of the present invention is carried out. In this embodiment, the thermal oxidation treatment at 950° C. for 30 minutes is carried out in the state where a hydrogen chloride gas is mixed in an oxygen atmosphere. Of course, other than hydrogen chloride, another halogen-based gas such as nitrogen trifluoride may be mixed. Also, it does not matter if the atmosphere is a well-known thermal oxidation atmosphere of dry oxygen, wet oxygen or the like (FIG. 4D).

In this way, trap levels and defects in the island-like silicon layers 309 disappear, so that it is possible to form island-like silicon layers 310 made of single crystal silicon layers that have no factor to block the movement of carriers. Also, a silicon oxide film 311 formed at this stage can be directly used also as a gate insulating film of a TFT.

In the manner described above, the island-like silicon layer without defects or the like is formed, and when a TFT having the silicon layer as its active layer is manufactured, the operation performance and reliability of the TFT can be greatly improved. With this, it is also possible to improve the operation performance and reliability of a semiconductor circuit employing TFTs, an electro-optical device, and further, an electronic apparatus.

Embodiment 4

This embodiment is an example in which the sequence of the manufacturing steps of embodiment 3 is changed. Until the middle of steps, steps are the same as in embodiment 3, their description will be omitted.

First, in the same procedure as in embodiment 3, steps until the bonding step of FIG. 3C are completed. Next, the heat treatment step of FIG. 3D is not carried out, but advances to the polishing step shown in FIG. 4A. Then the steps until the patterning step of FIG. 4C are completed.

After the island-like silicon layers are formed, a thermal oxidation treatment is carried out in that state. That is, the feature of this embodiment is that the stabilization of the bonded interface and the reduction of trap levels and defects in the island-like silicon layers are carried out by the same heat treatment (temperature range is 1050 to 1150° C.) simultaneously.

As described above, in embodiment 3, the heat treatment for stabilizing the bonded interface and the thermal oxidation step for reducing the trap levels and defects are separately carried out in the embodiment 3. However, in this embodiment, both steps are carried out in one step so that the number of steps can be reduced.

Embodiment 5

In this embodiment, a case where a TFT is manufactured by using an island-like silicon layer formed with the structure of embodiments 1 to 4 will be described with reference to FIGS. 5A to 5D.

Figure 5A:
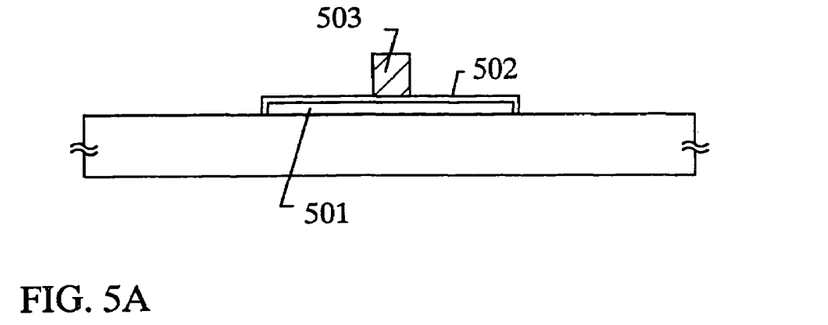
FIGS. 5A to 5D are views showing forming steps of a TFT of Embodiment 5.

First, in accordance with either one of manufacturing steps of embodiments 1 to 4, an island-like silicon layer 501 is formed. Incidentally, in this embodiment, a gate insulating film (silicon oxide film) 502 is formed simultaneously with a thermal oxidation step for removing the trap levels and the defects in the island-like silicon layer 501. Then a gate electrode 503 made of an n-type polysilicon film is formed on the gate insulating film 502 (FIG. 5A).

Next, an impurity for giving an n-type or p-type is added using the gate electrode 503 as a mask in a self-aligning manner. In this embodiment, as an example in which an n-type TFT is manufactured, phosphorus is added as the impurity. Of course, when a p-type TFT is formed, it is appropriate that boron is added. By this step, an impurity region 504 is formed (FIG. 5B).

In addition, it is also effective to control a threshold value voltage of the TFT by adding an opposite conductivity impurity (for example, boron for the n-type TFT) in the silicon layer just under the gate electrode. This impurity may be added by through doping from the above of the gate electrode, or may be previously added prior to the formation of the gate electrode.

Figure 5B:
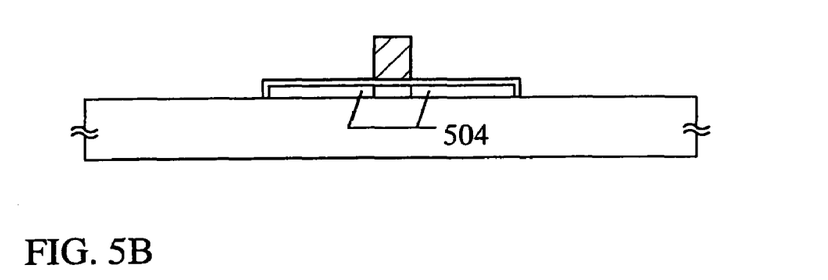

When the state of FIG. 5B is obtained in this way, a side wall (side spacer) 505 made of a silicon oxide film is next formed. The side wall 505 can be formed by using a well-known anisotropic etching technique.

After the side wall 505 is formed, an adding step of phosphorus is again carried out, so that an impurity region with a concentration higher than the foregoing impurity region 504 is formed. Through the two impurity adding steps, a source region 506, a drain region 507, an LDD region 508, and a channel formation region 509 are defined (FIG. 5C).

Next, a thermal annealing step is carried out, so that the impurity added in the former step is activated and damage of the silicon layer caused at the time of addition is repaired. It is appropriate that this thermal annealing step is carried out by using any one of or combination of a furnace annealing, a laser annealing, and a lamp annealing.

Figure 5C:
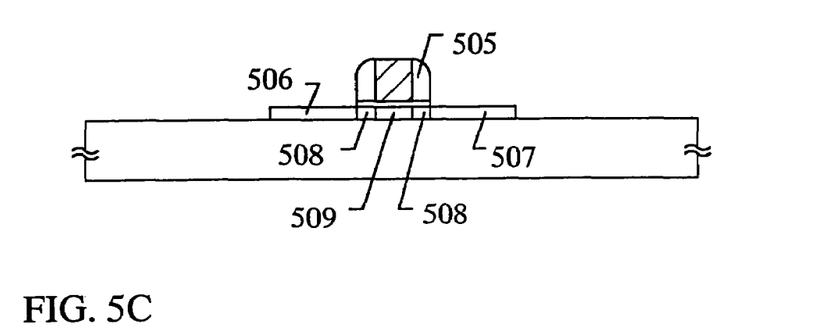

Next, in the state of FIG. 5C, the entire surface is covered with a cobalt film (not shown), and a thermal annealing treatment is carried out, so that a cobalt silicide layer 510 is formed. Other than cobalt, a metal film of titanium, tungsten, or the like may be used. Since this step is a well-known salicide technique, its detailed description will be omitted.

Next, an interlayer insulating film 511 made of a resin material and having a thickness of 1 μm is formed. As the interlayer insulating film 511, a silicon oxide film, a silicon nitride film, or a silicon nitride oxide film may be used, or these insulating films may be laminated.

Next, contact holes are formed in the interlayer insulating film 511, and a source wiring line 512 and a drain wiring line 513 made of a material containing aluminum as its main ingredient are formed. Finally, the furnace annealing at 350° C. for two hours is carried out for the whole component in a hydrogen atmosphere, so that hydrogenating is completed.

Figure 5D:
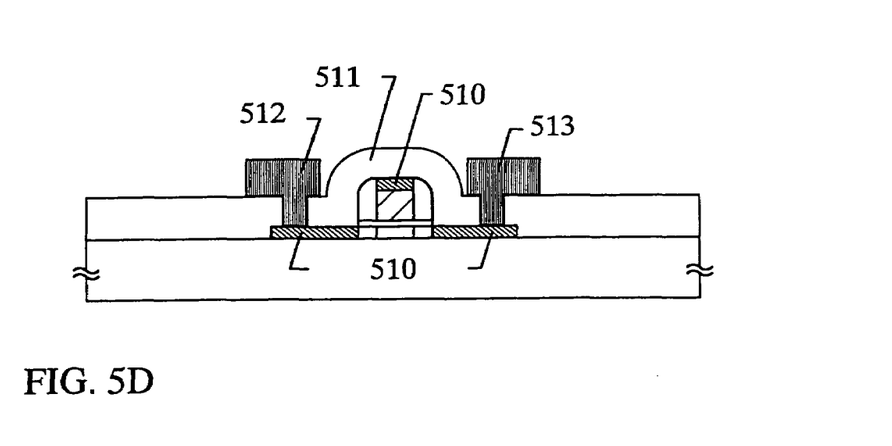

In this way, the TFT as shown in FIG. 5D is obtained. It should be noted that the structure described in this embodiment is merely shown as an example, and the TFT structure to which the present invention can be applied is not limited to this. Therefore, the present invention can be applied to a TFT of any well-known top gate structure.

Further, in the structure of FIG. 5D, when a pixel electrode (not shown) electrically connected to the drain wiring line 513 is formed by well-known means, it is also easy to form a pixel switching element of an active matrix type display device.

That is, the present invention is a very effective technique also as a manufacturing method of an electro-optical device such as a liquid crystal display device or an EL (electroluminescence) display device.

As described above, the present invention can be applied to TFTs of any structure, and various semiconductor circuits can be constructed by using the present invention. That is, it can be said that the present invention can be applied to any semiconductor device including a semiconductor circuit formed of TFTs.

Embodiment 6

Figure 6:
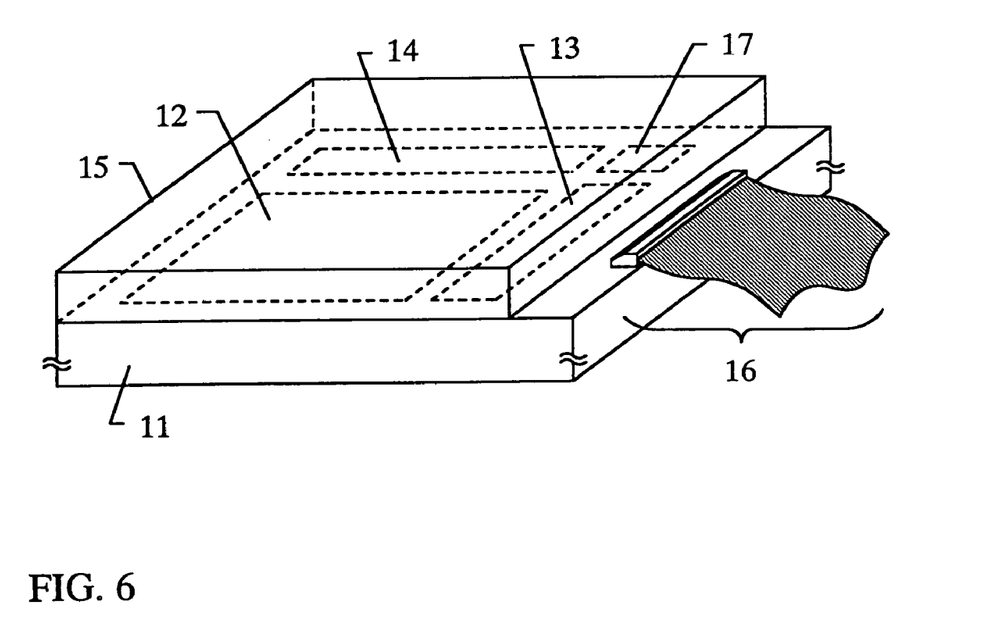
FIG. 6 is a view showing the structure of a semiconductor circuit of Embodiment 6.

FIG. 6 of this embodiment shows an example of a liquid crystal display device in which a semiconductor circuit is constructed by TFTs formed in accordance with the manufacturing steps of embodiment 5. Since well-known means can be used for a manufacturing method of a pixel TFT (pixel switching element) and/or a peripheral driver circuit and for a cell assembling step, the detailed description will be omitted.

In FIG. 6, reference numeral 11 denotes a substrate having an insulating surface, 12 denotes a pixel matrix circuit, 13 denotes a source driver circuit, 14 denotes a gate driver circuit, 15 denotes an opposite substrate, 16 denotes an FPC (flexible printed circuit), and 17 denotes a signal processing circuit.

As the signal processing circuit 17, it is possible to form a circuit, such as a D/A converter, a γ correction circuit, or a signal dividing circuit, which performs such a process that an IC has conventionally substituted. Of course, it is also possible that an IC chip is provided on a glass substrate and signal processing is carried out on the IC chip.

Further, in this embodiment, the description has been made on the liquid crystal display device as an example. However, it is needless to say that the present invention can be applied to an EL (electroluminescence) display device or an EC (electrochromic) display device if the display device is of an active matrix type.

Incidentally, when the liquid crystal display device shown in this embodiment is manufactured, any structure of embodiments 1 to 4 may be used.

Embodiment 7

The present invention can be applied to any conventional IC technique. That is, the present invention can be applied to any semiconductor circuit currently available on the market. For example, the present invention may be applied to a microprocessor such as a RISC processor or ASIC processor integrated on one chip, or may be applied to any circuit from a signal processing circuit such as a D/A convertor to a high frequency circuit for a portable equipment (cellular phone, PHS, mobile computer).

Figure 7:
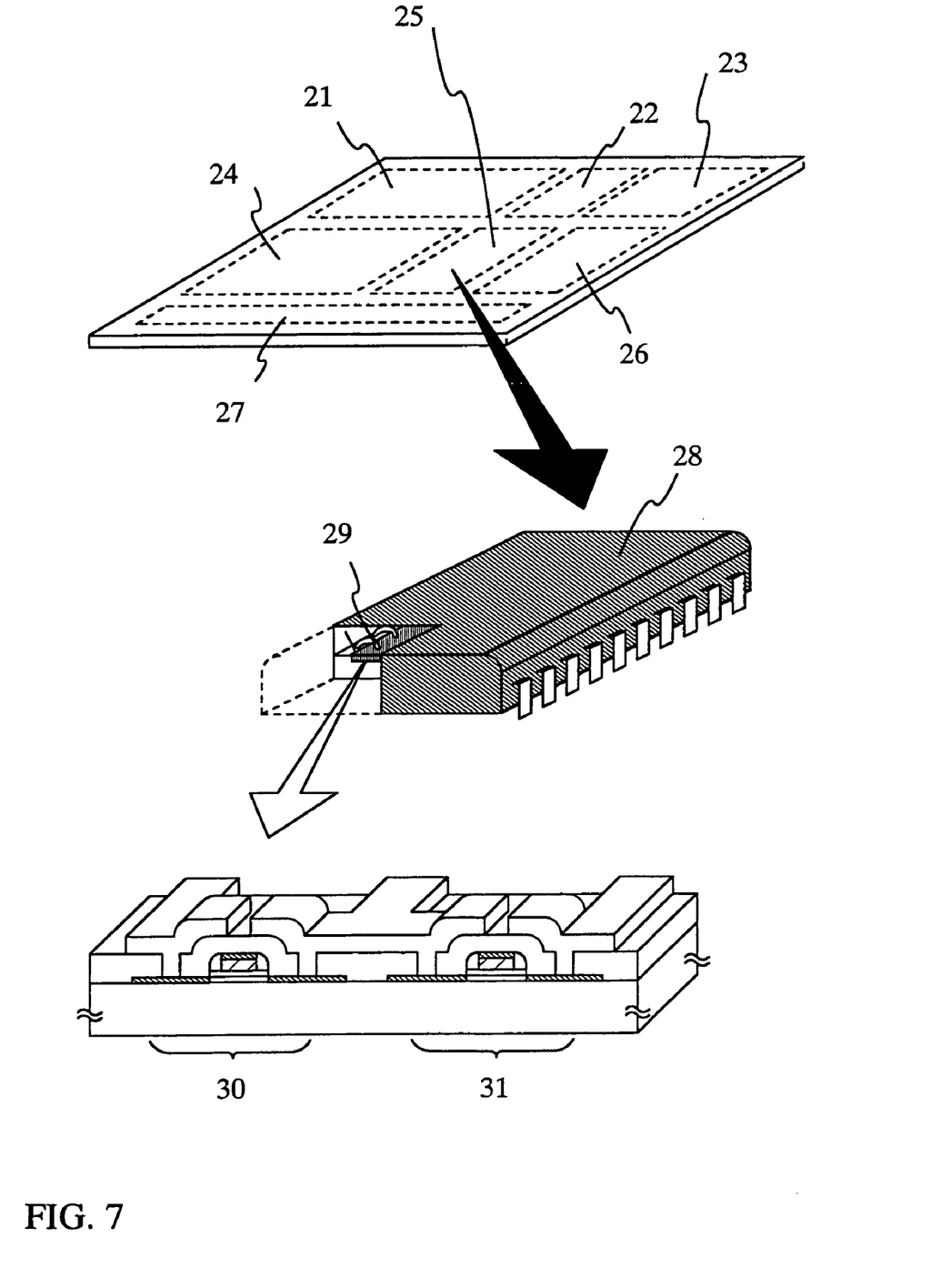
FIG. 7 is a view showing the structure of a semiconductor circuit of Embodiment 7.

FIG. 7 shows an example of a microprocessor. The microprocessor is typically constructed by a CPU core 21, a RAM 22, a clock controller 23, a cache memory 24, a cache controller 25, a serial interface 26, an I/O port 27, and the like.

Of course, FIG. 7 shows a simplified example of a microprocessor, and a variety of circuit designs are carried out for an actual microprocessor according to its use.

However, in any microprocessor with any function, a portion functioning as the center is an IC (Integrated Circuit) 28. The IC 28 is a functional circuit in which an integrated circuit formed on a semiconductor chip 29 is protected by a ceramic or the like.

The integrated circuit formed on the semiconductor chip 29 is constructed by an N-channel TFT 30 and a P-channel TFT 31 having the structure of the present invention. Incidentally, when a basic circuit is constructed by a CMOS circuit including the N-channel TFT 30 and the P-channel TFT 31 as a minimum unit, power consumption can be suppressed.

In addition, the microprocessor shown in this embodiment is incorporated on various electronic equipments and functions as the central circuit. As a typical equipment, a personal computer, a portable information terminal equipment, and any other electric home products can be enumerated. Also, a computer for controlling a vehicle (car, electric train, etc.) can also be enumerated.

Embodiment 8

CMOS circuits and pixel active matrix circuits produced by the embodiments of the present invention can be applied to a plurality of electro-optical devices (e.g. an active matrix type liquid crystal display, an active matrix type EL display, and an active matrix type EC display). That is, the present invention can be carried out for all the electric apparatus including such the electro-optical devices as display media.

As such electronic apparatus, a video camera, a digital camera, a projector (rear type or front type), a head mount display (a goggle type display), a car navigation system, a personal computer, a portable information terminal (mobile computer, portable telephone, electric book, etc.) and the like are enumerated. Examples of those are shown in FIG. 8A to FIG. 8F, FIG. 9A to FIG. 9D, and FIG. 10A to FIG. 10C.

Figure 8A:
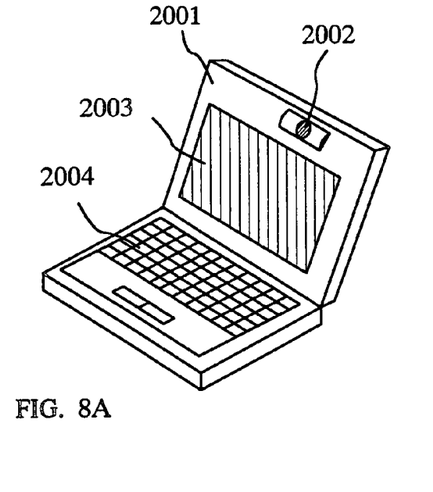
FIGS. 8A to 8F are views showing the structures of electronic apparatuses of Embodiment 8.

FIG. 8A shows a personal computer which is constituted by a main body 2001, an image input portion 2002, a display device 2003, and a keyboard 2004. The present invention can be applied to the image input portion 2002, the display device 2003, and other signal control circuits.

Figure 8B:
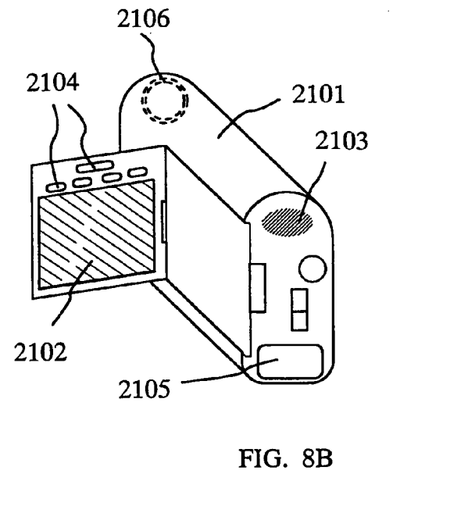

FIG. 8B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 8C:
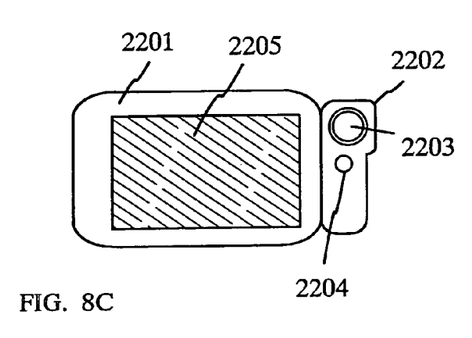

FIG. 8C shows a mobile computer which is constituted by a main body 2201, a camera portion 2202, an image receiving portion 2203, an operation switch 2204, and a display device 2205. The present invention can be applied to the display device 2205 and other signal control circuits.

Figure 8D:
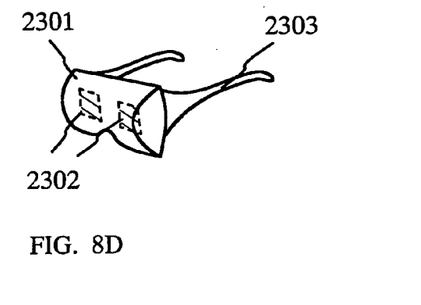

FIG. 8D shows a goggle type display which is constituted by a main body 2301, a display device 2302, and an arm portion 2303. The present invention can be applied to the display device 2302 and other signal control circuits.

Figure 8E:
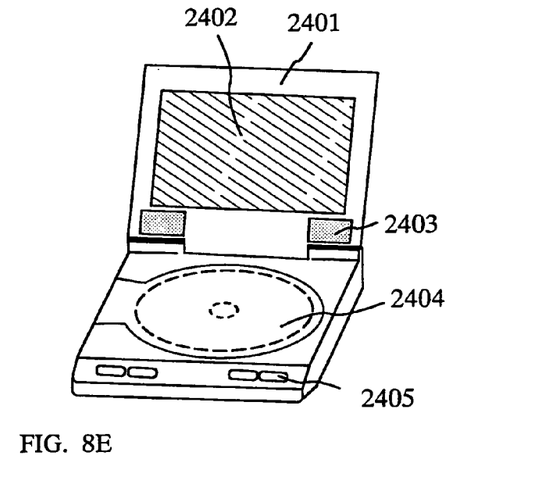

FIG. 8E shows a player apparatus which is equipped with a recording medium for recording a program (hereinafter, called "a recording medium"). The player apparatus is constituted by a main body 2401, a display device 2402, a speaker portion 2403, a recording medium 2404, an operation switch 2405 and an eternal input portion 2406. This apparatus includes a DVD (digital Versatile Disc), a CD and the like as the recording medium for appreciating music and movie, playing a game, and Internet. The present invention can be applied to the display device 2402 and other signal control circuits.

Figure 8F:
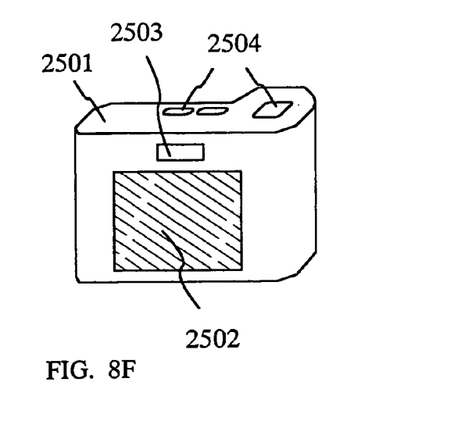

FIG. 8F shows a digital camera which is constituted by a main boy 2501, a display device 2502, an eyepiece portion 2503, an operation switch 2504 and an image receiving portion (not shown). The present invention can be applied to the display device 2502 and other signal control circuits.

Figure 9A:
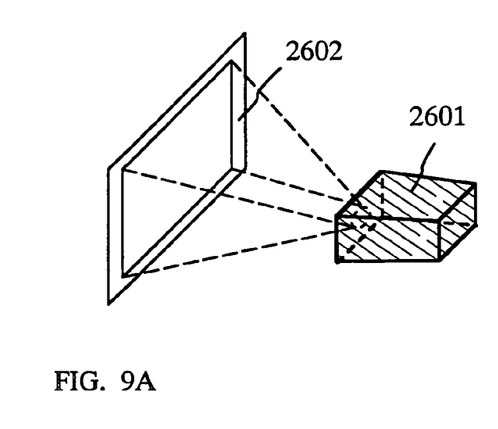
FIGS. 9A to 9D are views showing structures of electronic apparatuses of Embodiment 9.

FIG. 9A shows a front type projector which is constituted by a light source optical system and a display device 2601, and a screen 2602. The present invention can be applied to the display device and other signal control circuits.

Figure 9B:
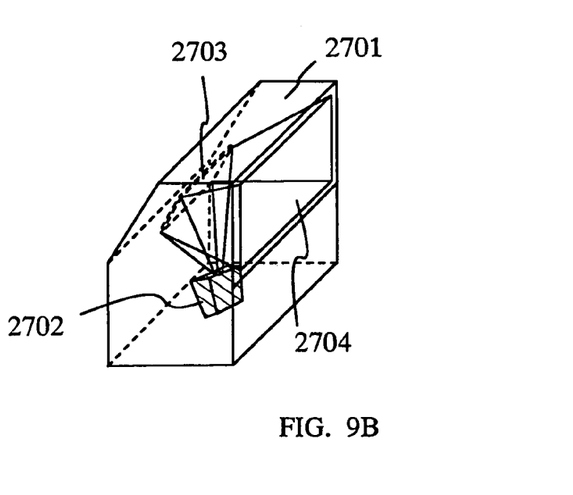

FIG. 9B shows a rear type projector which is constituted by a main body 2701, a light source optical system and a display device 2702, a mirror 2703 and a screen 2704. The present invention can be applied to the display device and other signal control circuits.

Figure 9C:
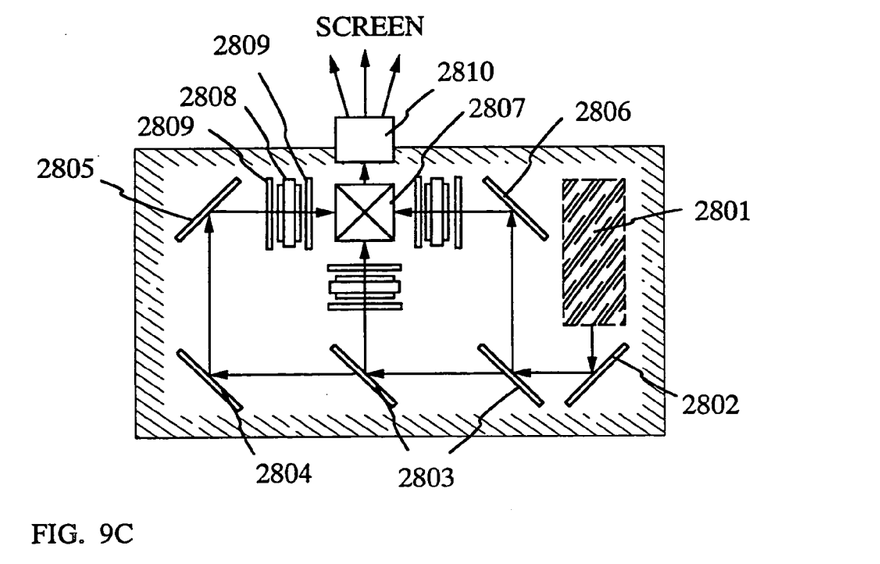

FIG. 9C shows an example structure of a light source optical system and a display device 2601 in FIG. 9A, or 2702 in FIG. 9B. Each of numerals 2601 and 2702 includes a light source optical system 2801, mirrors 2802, 2804–2806, a dichroic mirror 2803, another optical system 2807, a display device 2808, a phase difference plate 2809, and a projection optical system 2810. The projection optical system 2810 is constituted by a plurality of optical lenses equipped with a projection lens. Such a projection system as shown in FIG. 9C is called a three-plate type since this structure includes three plates of display devices. Further, it is proper for a researcher to form, in an optical path indicated by an arrow in FIG. 9C, an optical lens, a film with a polarizing characteristics, a film to control a phase difference, an IR film, etc.

Figure 9D:
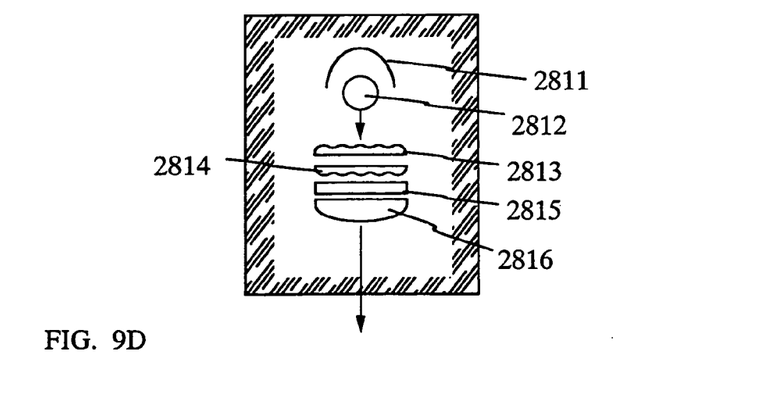

FIG. 9D shown an example structure of a light source optical system 2801 in FIG. 9C. In this embodiment, the light source optical system 2801 includes a reflector 2811, a light source 2812, lens arrays 2813 and 2814, a polarizing conversion element 2815 and a condenser lens 2816. However, the present invention is not specifically limited by this embodiment because it is just an example. For example, in an optical path, an optical lens, a film with a polarizing characteristics, a film to control a phase difference, an IR film, etc. can be properly formed.

Figure 10A:
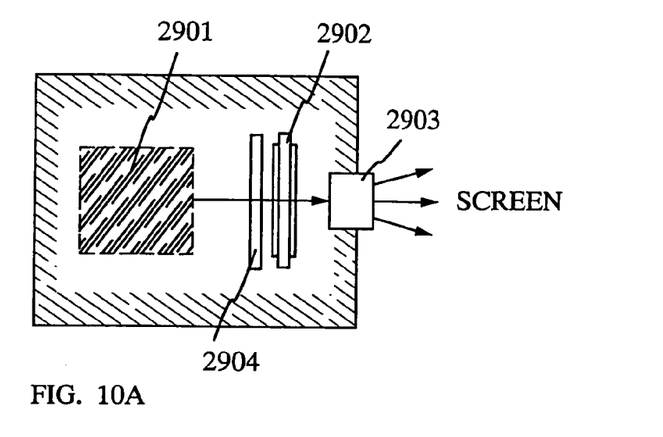
FIGS. 10A to 10C are view showing structures of electronic apparatuses of Embodiment 10.

While FIG. 9C shows an example of the three-plate type, FIG. 10A shows an example of single-plate type. A light source optical system 2901, a display device 2902, a projection optical system 2903 are included in a light source optical system and a display device shown in FIG. 10A. It is possible to apply the light source optical system and display device shown in FIG. 10A to the light source optical system and display device 2601 shown in FIG. 9A, or 2702 in FIG. 9B. Further, the light source optical system 2901 can be applied by the light source optical system shown in FIG. 9D. In addition, the display device 2902 is equipped with a color filter (not shown), so that display image is colored.

Figure 10B:
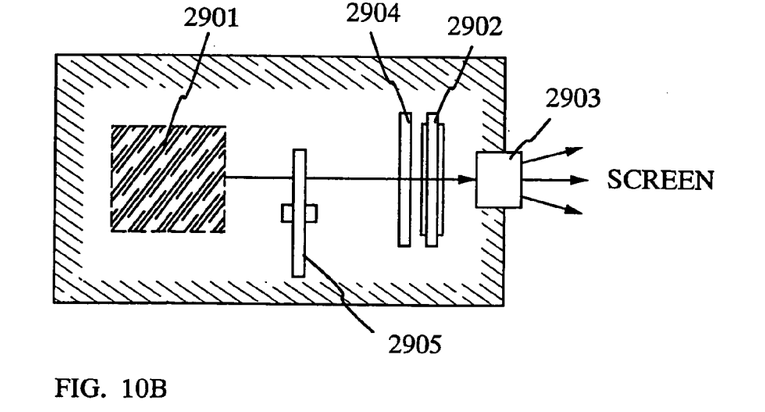

FIG. 10B shows an applied example of a light source optical system and a display device which is applied by FIG. 10A. Instead of forming a color filter, a display image is colored by RGB rotary color filter disc 2905. It is possible to apply the light source optical system and display device shown in FIG. 10B to the light source optical system and display device 2601 shown in FIG. 9A, or 2702 in FIG. 9B.

Figure 10C:
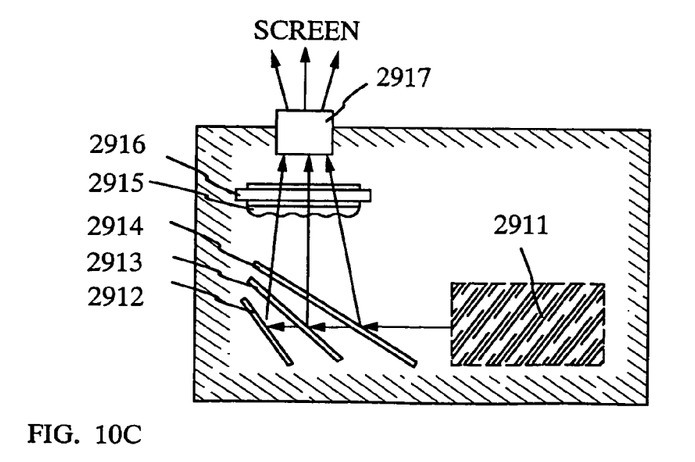

A structure of the light source optical system and display device, as shown in FIG. 10C is called as a color-fileterless single-plate type. In this structure, a display device 2916 is equipped with a microlens array 2915, and a display image is colored by a dichroic mirror (Green) 2912, a dichroic mirror (Red) 2913 and a dichroic mirror (Blue). A projection optical system 2917 is constituted by a plurality of lenses including a projection lens. It is possible to apply the light source optical system and display device shown in FIG. 10C to the light source optical system and display device 2601 shown in FIG. 9A, or 2702 in FIG. 9B. Further, as the light source optical system 2911, an optical system having a coupling lens and a collimating lens other than a light source can be applied.

As described above, the present invention can be applied in a large range, so that it is possible to apply to any electric apparatus in every field. In addition, the electric apparatus in the instant invention can be realized by using any structure combined with Embodiments 1–7.

As is apparent from the foregoing description, the present invention has the following effects.

When a single crystal silicon thin film is formed by a bonding SOI technique typified by Smart-Cut method or ELTRAN method, the crystallinity of the inside of a formed silicon layer can be restored to almost complete single crystal. That is, it becomes possible to use a single crystal silicon thin film with few trap levels and defects as an active layer of a TFT.

Thus, it becomes possible to greatly improve the operation performance and reliability of a plurality of TFTs formed on a substrate. Also, with the above-mentioned improvements, it is possible to realize an improvement of the operation performance and reliability of a semiconductor circuit formed of a plurality of TFTs, an electro-optical device, and further, an electronic apparatus incorporating the semiconductor circuit or electro-optical device therein.

What is claimed is:

1. A method of manufacturing a semiconductor device, said method comprising the steps of:
    forming a silicon oxide film on a first single crystal silicon substrate;
    adding hydrogen to the first single crystal silicon substrate through the silicon oxide film to form a hydrogen added layer in the first single crystal silicon substrate
    bonding the first single crystal silicon substrate to a second substrate through the silicon oxide film with a bonded interface therebetween, said second substrate being as a support;
    separating the first single crystal silicon substrate by a first heat treatment;
    carrying out a second heat treatment to a single crystal silicon film which remains on the second substrate in the separating step so that the bonded interface becomes stable wherein trap levels and defects are generated due to the second heat treatment;
    flattening a surface of the single crystal silicon film;
    forming a silicon island by patterning the single crystal silicon film after carrying out the second heat treatment; and
    thermally oxidizing the silicon island to reduce the trap levels and defects from the silicon island.

2. A method according to claim 1, wherein the thermally oxidizing step is carried out at a temperature in a range of from 1050 to 1150° C.

3. A method according to claim 1, wherein the thermally oxidizing step is carried out in an oxidizing atmosphere comprising a halogen element.

4. A method according to claim 1, wherein said semiconductor device is one selected from the group consisting of a D/A converter, a γ correction circuit, and a signal dividing circuit.

5. A method according to claim 1, wherein said semiconductor device is one selected from the group consisting of a liquid crystal display device, an EL (electroluminescence) display device and an EC (electrochromic) display device.

6. A method according to claim 1, wherein said semiconductor device is a microprocessor.

7. A method according to claim 1, wherein said semiconductor device is a computer for controlling a vehicle such as a car or an electric train.

8. A method according to claim 1, wherein said semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

9. A method of manufacturing a semiconductor device, said method comprising the steps of:
forming a silicon oxide film on a first single crystal silicon substrate;
adding hydrogen to the first single crystal silicon substrate through the silicon oxide film to form a hydrogen added layer in the first single crystal silicon substrate;.
bonding the first single crystal silicon substrate to a second substrate through the silicon oxide film with a bonded interface therebetween, said second substrate being as a support wherein said second substrate is a quartz substrate;
separating the first single crystal silicon substrate by a first heat treatment;
carrying out a second heat treatment to a single crystal silicon film which remains on the second substrate in the separating step so that the bonded interface becomes stable wherein trap levels and defects are generated due to the second heat treatment;
forming a silicon island by patterning the single crystal silicon film after carrying out the second heat treatment; and
thermally oxidizing the silicon island to reduce the trap levels and the defects from the silicon island.

10. A method according to claim 9, wherein the thermally oxidizing step is carried out at a temperature in a range of from 1050 to 1150° C.

11. A method according to claim 9, wherein the thermally oxidizing step is carried out in an oxidizing atmosphere comprising a halogen element.

12. A method according to claim 9, wherein said semiconductor device is one selected from the group consisting of a D/A converter, a γ correction circuit, and a signal dividing circuit.

13. A method according to claim 9, wherein said semiconductor device is one selected from the group consisting of a liquid crystal display device, an EL (electroluminescence) display device and an EC (electrochromic) display device.

14. A method according to claim 9, wherein said semiconductor device is a microprocessor.

15. A method according to claim 9, wherein said semiconductor device is a computer for controlling a vehicle such as a car or an electric train.

16. A method according to claim 9, wherein said semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

17. A method of manufacturing a semiconductor device, said method comprising the steps of:
forming a silicon oxide film on a first single crystal silicon substrate;
adding hydrogen to the first single crystal silicon substrate through the silicon oxide film to form a hydrogen added layer in the first single crystal silicon substrate;
bonding the first single crystal silicon substrate to a second substrate through the silicon oxide film with a bonded interface therebetween, said second substrate being as a support wherein said second substrate is a silicon substrate;
separating the first single crystal silicon substrate by a first heat treatment;
carrying out a second heat treatment to a single crystal silicon film which remains on the second substrate in the separating step so that the bonded interface becomes stable wherein trap levels and defects are generated due to the second heat treatment;
forming a silicon island by patterning the single crystal silicon film after carrying out the second heat treatment; and
thermally oxidizing the silicon island to reduce the trap levels and the defects from the silicon island.

18. A method according to claim 17, wherein the thermally oxidizing step is carried out at a temperature in a range of from 1050 to 1150° C.

19. A method according to claim 17, wherein the thermally oxidizing step is carried out in an oxidizing atmosphere comprising a halogen element.

20. A method according to claim 17, wherein said semiconductor device is one selected from the group consisting of a D/A converter, a γ correction circuit, and a signal dividing circuit.

21. A method according to claim 17, wherein said semiconductor device is one selected from the group consisting of a liquid crystal display device, an EL (electroluminescence) display device and an EC (electrochromic) display device.

22. A method according to claim 17, wherein said semiconductor device is a microprocessor.

23. A method according to claim 17, wherein said semiconductor device is a computer for controlling a vehicle such as a car or an electric train.

24. A method according to claim 17, wherein said semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

* * * * *